(12) United States Patent
Chan

(10) Patent No.: US 6,798,667 B2
(45) Date of Patent: Sep. 28, 2004

(54) SOLDER BALL COLLAPSE CONTROL APPARATUS AND METHOD THEREOF

(75) Inventor: Vincent K. Chan, Richmond Hill (CA)

(73) Assignee: ATI Technologies, Inc., Markham (CA)

( * ) Notice: Subject to any disclaimer, the term of this patent is extended or adjusted under 35 U.S.C. 154(b) by 0 days.

(21) Appl. No.: 10/064,857

(22) Filed: Aug. 23, 2002

(65) Prior Publication Data

US 2004/0037060 A1 Feb. 26, 2004

(51) Int. Cl.⁷ .......................... H05K 7/10; H05K 7/12
(52) U.S. Cl. .............. 361/767; 361/803; 361/735; 361/790; 438/613; 257/738; 257/780; 257/779; 257/786; 257/781
(58) Field of Search ................ 361/767, 803, 361/735, 790, 760, 761, 764, 783; 438/613; 257/738, 780, 779, 786, 781, 737, 778, 777, 772

(56) References Cited

U.S. PATENT DOCUMENTS

| | | | | |
|---|---|---|---|---|
| 5,488,200 A | * | 1/1996 | Tsukada | 174/261 |
| 5,796,169 A | * | 8/1998 | Dockerty et al. | 257/780 |
| 5,895,554 A | * | 4/1999 | Gordon | 156/556 |
| 5,907,187 A | * | 5/1999 | Koiwa et al. | 257/737 |
| 5,956,606 A | * | 9/1999 | Burnette | 438/615 |
| 6,127,735 A | * | 10/2000 | Berger et al. | 257/778 |
| 6,148,900 A | * | 11/2000 | Yamasaki et al. | 164/80 |
| 6,150,717 A | * | 11/2000 | Wood et al. | 257/738 |
| 6,211,571 B1 | * | 4/2001 | Zakel et al. | 257/780 |
| 6,313,521 B1 | * | 11/2001 | Baba | 257/678 |
| 6,527,159 B2 | * | 3/2003 | Matthies et al. | 228/103 |

* cited by examiner

*Primary Examiner*—David A. Zarneke
*Assistant Examiner*—Thanh Y. Tran
(74) *Attorney, Agent, or Firm*—Vedder, Price, Kaufman & Kammholz, PC

(57) ABSTRACT

A solder ball collapse control apparatus and method thereof includes a plurality of first solder members, pieces of solder material in a shape capable of being used to properly create a solder joint. The first solder members have a first solder dimension and a first melting temperature and are disposed on a carrier substrate, wherein the first solder members include any piece of material capable of being disposed using a solder dispensing machine. The apparatus and method further includes a plurality of second members having a second dimension and a second melting temperature, disposed on the carrier substrate in relation to the plurality of first solder members. The second members include any piece of material capable of being disposed using the solder dispensing machine, wherein the first solder member dimension is greater than the second member dimension and the second melting temperature is greater than the first melting temperature.

11 Claims, 6 Drawing Sheets

SOLDER BALL COLLAPSE CONTROL APPARATUS AND METHOD THEREOF

BACKGROUND OF INVENTION

The present invention relates generally to an apparatus having a plurality of solder connections and more specifically to an integrated circuit having a solder ball array.

A typical computing system is composed of multiple processors and various memory components disposed on multiple fabricated chips of integrated circuits which may be integrated using different forms of intermediate mediums for interconnecting the components, such that the different processors and memories may interact. One common example of a connecting medium is a printed circuit board (PCB) as the PCB provides electrical connection between the processors, memories, and different input and output devices.

With the refinement of processing systems and the further integration of processing elements in combination with smaller space requirements for modern computing systems, problems can arise in the manufacturing of these computing systems with the connection of the multiple components. Typically, the components are connected directly to each other and through the PCB, wherein the components are soldered together using a plurality of solder balls to create solder joints or a wire bond connection. Solder joints provide an electrical connection between the individual component and the PCB, and also maintain the position of the component relative to the PCB.

As the amount of available space with the processing system decrease, a major concern is heat between the components. In order to provide proper operations of the processing system, minimum distances are required to allow air gaps between the components and the printed circuit board. Furthermore, these air gaps must be maintained with respect to the solder joints.

One solution to providing and maintaining the minimum distance between two elements when they are soldered together is to place at least one column member composed of a material having a higher melting temperature amongst the plurality of solder balls such that when solder balls are melted, the column members do not melt. Thereupon, as the solder balls melt, the columns maintain the minimum distance.

During manufacturing of an integrated circuit, it is cost prohibitive to manufacture an integrated circuit having the plurality of solder balls and then also add another manufacturing step of placing the plurality of spacers, such as columns, on the integrated circuit. For cost effectiveness, when the integrated circuit is being manufactured, there exists a need for maintaining the collapse of the solder balls to allow for the air gap while also not requiring additional manufacturing steps.

BRIEF DESCRIPTION OF DRAWINGS

The invention will be more readily understood with reference to the following drawings, wherein.

DETAILED DESCRIPTION

Generally, a solder ball collapse control apparatus includes a plurality first solder members, wherein the first solder members are pieces of solder material in a shape capable of being used to properly create a solder joint. Each of the first solder members have a first solder dimension and a first melting temperature. The first solder members are disposed on a carrier substrate, wherein the first solder members include any piece of material capable of being disposed on the carrier substrate using a solder dispensing machine. The solder ball collapse control apparatus further includes a plurality of second members, each having a second member dimension and a second melting temperature. The plurality of second members are disposed on the carrier substrate in a corresponding relationship to the plurality of first solder members. The second members include any piece of material capable of being disposed on the carrier substrate using the solder dispensing machine. The first solder member dimension is greater than the second member dimension and the second melting temperature is greater than the first melting temperature.

The solder ball collapse control apparatus provides for a minimum distance between the carrier substrate and any surface upon which the substrate may be attached, such as a printed circuit board (PCB). When a soldering heat having a temperature greater than or equal to the first melting temperature and less than the second melting temperature is applied, the first solder members are melted to create solder joints and the second members do not melt, thereby maintaining the minimum distance.

In another embodiment, the second members further include an outer layer of solder material having a melting temperature approximately equivalent to the first melting temperature, wherein when the soldering heat is applied, the second members create a solder control joint, allowing for both an electrical solder joint and maintenance of the minimum distance.

Figure 1:
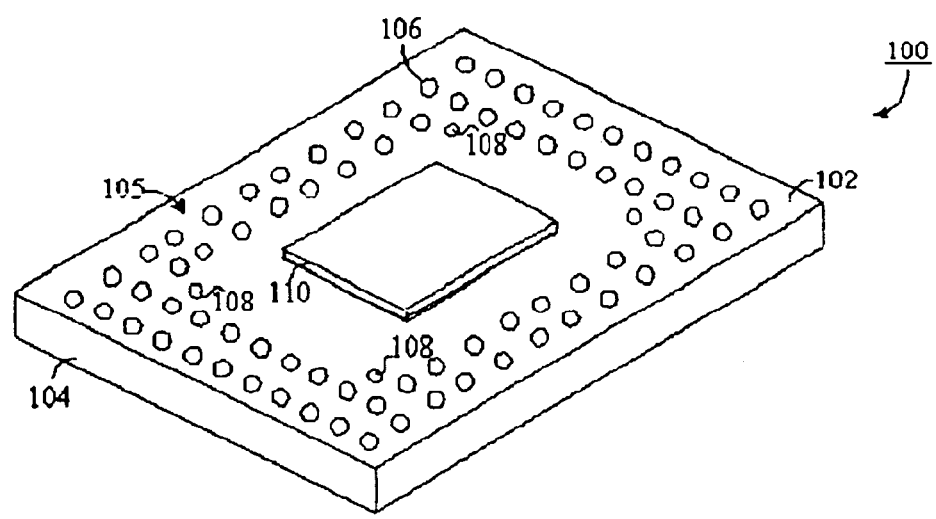
FIG. 1 is a perspective illustration of a bottom surface on an integrated circuit, in accordance with one embodiment of the present invention.

FIG. 1 illustrates an integrated circuit 100, more specifically a bottom surface 102 of a carrier substrate 104 of the integrated circuit 100. Disposed on the bottom surface 102 is a solder ball array 105, wherein the solder ball array 105 includes a plurality of first solder members 106 and a plurality of second members 108. Further illustrated in FIG. 1 is an application specific integrated circuit (ASIC) 110 disposed on the carrier substrate and within the solder ball array 104.

The carrier substrate may be composed of bizmalemide triazine (BST) having a plurality of internal wiring (not visible) for connecting the ASIC 110 to the solder ball connection points, not visible as they are disposed underneath the plurality of first solder members 106. The term solder member, also generally referred to as a solder ball, is generally used to refer to any type of a solder deposit capable of being injected on the carrier substrate 104 by a solder dispensing machine, for example an MSA-250-A-pluss manufactured by Motorola, Inc., 1303 East Algonquin Road, Schaumburg, Ill. USA. A typical solder member, such as 106, has a bulbous shape, but as recognized by one having ordinary skill in the art, by adjusting the viscosity and chemical make-up of the solder member, the shape of the solder member may be readily adjusted to a different shape. Therefore, a solder member, as used herein, includes any shape that may create a solder joint, including but not limited to a square, a rectangle, a dome, a ball, or any other shape as recognized by one having ordinary skill in the art.

The plurality of first solder members 106 are composed of a solder material having a first melting temperature, such as, but not limited to, a lead tin eutectic alloy with a melting temperature of approximately 183 degrees centigrade. Furthermore, the plurality of first solder members have a first dimension, such as, but not limited to, approximately 0.6 millimeters in diameter. In the preferred embodiment, the first solder member 106 is a solder ball, but as stated above, may include any other solder member shape.

Further disposed within the solder ball array 106 are the plurality of second members 108. The second members 108 have a second dimension and a second melting point. The second members 108 are composed of a material having a melting temperature higher than the first melting point, such as, but not limited to, a high lead content material, such as, but not limited to, over approximately 95 percent lead, which has a melting temperature approximately greater than 300 degrees centigrade, and further consist of any member capable of being dispensed by the solder dispensing machine. In one embodiment, the second members 108 are in the shape of solder balls, as readily dispensed by the solder dispensing machine. In one embodiment, the second dimension of the second members 108 is approximately 0.45 millimeters in diameter, which provides a minimum dimension between the application specific integrated circuit 110 and the item upon which the carrier substrate 104 may be soldered. As recognized by one having ordinary skill in the art, any other suitable dimension for the second member may be utilized and the stated dimension is not meant to be so limiting herein.

Figure 2:
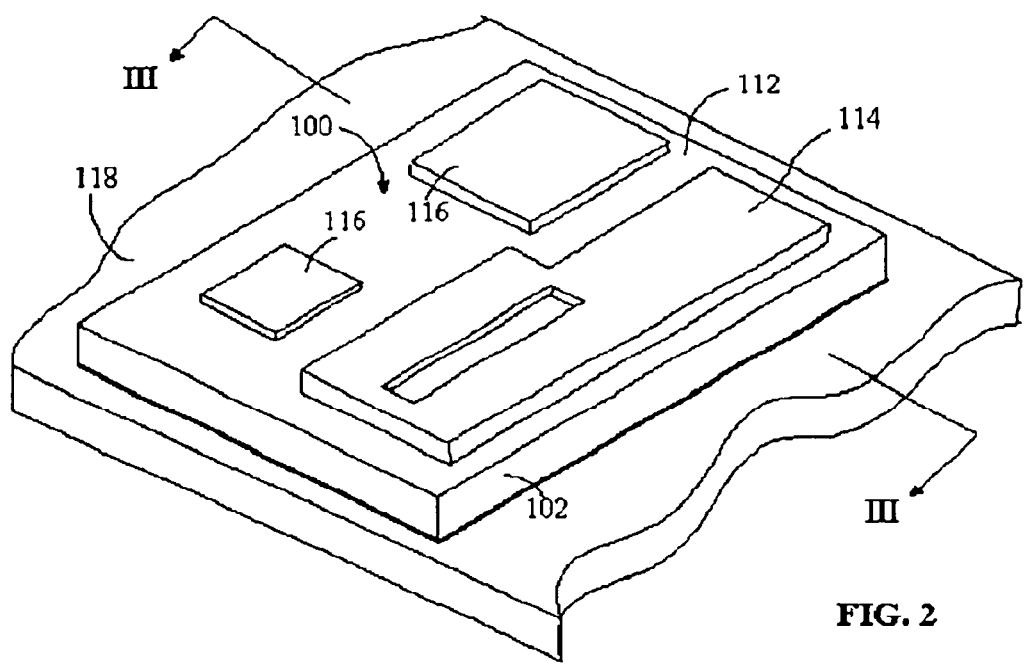
FIG. 2 is a perspective view of a top surface of the integrated circuit of FIG. 1 in relation to a printed circuit board, in accordance with one embodiment of the present invention.

FIG. 2 illustrates the integrated circuit 100 and the carrier substrate 102, more specifically a top surface 112 having a heat sink 114 and a plurality of chip scale packaged memories 116 disposed thereon. For further reference, the circuit having the application specific integrated circuit 110 on the bottom surface 102 and the heat sink 112 with multiple chip scale packaged memories 116 is discussed in copending patent application entitled INTEGRATED CIRCUIT HAVING MEMORY DISPOSED THEREON AND METHOD OF MAKING THEREOF having Ser. No. 10/064,856 with a filing date of Aug. 23, 2002.

Further illustrated in FIG. 2, the integrated circuit 100 is disposed upon a connection surface 118, such as a PCB. Not visible in FIG. 2, the integrated circuit 102 is disposed on top of the first surface 118 in contact by the solder ball array 106.

Figure 3:
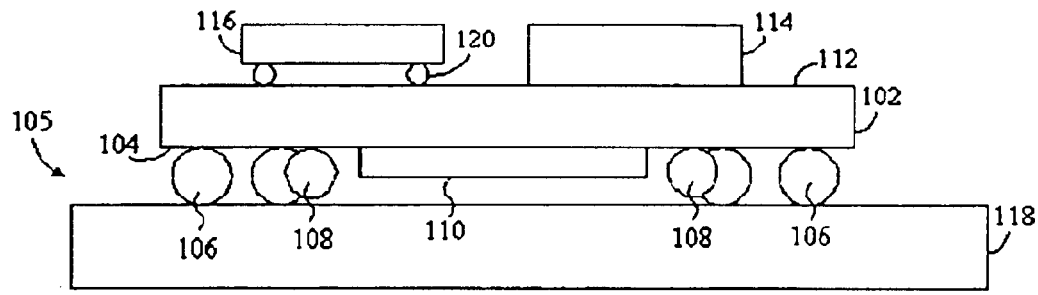
FIG. 3 is a cross-sectional view of FIG. 2 along the lines III—III.

In order to provide further clarification, FIG. 3 illustrates a cross-sectional view of FIG. 2 along the cross-sectional line III—III. As illustrated in FIG. 3, the solder ball array 105, consisting of the first solder balls 106 and the second members 108 are disposed between the carrier substrate 102 and the printed circuit board 118. Further illustrated is the relationship of the ASIC 110 with relation to the printed circuit board 118. FIG. 3 also illustrates the connection of the second members 108 to the bottom surface 104 of the carrier substrate. Also shown in FIG. 3, disposed on the top surface 112 of the carrier substrate 102 are the heat sink 114 and the chip scale package memory 116. The chip scale package memory is in contact with the carrier substrate 102 using a plurality of solder balls 120 similar to the first solder members 106, having a dimension of approximately 0.3 millimeters similar melting temperature of approximately 183 degrees centigrade.

Figure 4:
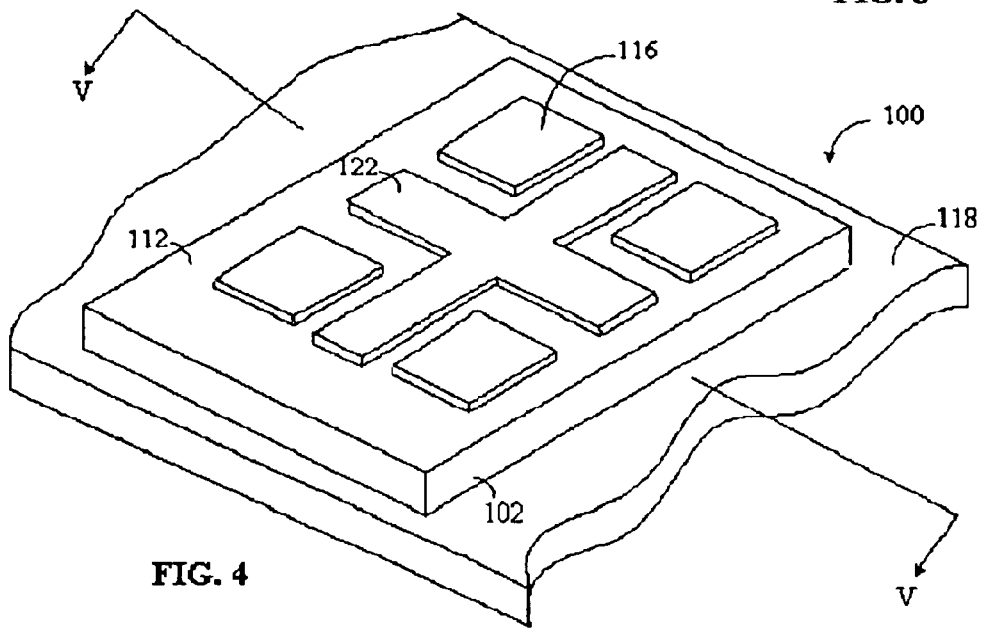
FIG. 4 illustrates another embodiment of the top surface of the integrated circuit in relation to the printed circuit board, in accordance with one embodiment of the present invention.

FIG. 4 illustrates an alternative embodiment of the integrated circuit 100 having the plurality of memories 116 and a heat sink 122 disposed on the top surface 112 of the carrier substrate 102 disposed in relation to the printed circuit board 118. Not visible within FIG. 4, the integrated circuit contains the ASIC 110 and solder ball array 105 on the bottom surface between the printed circuit board 100 and the carrier substrate 118.

During the manufacturing process, to solder the integrated circuit 100 to the printed circuit board 118, a soldering heat having a temperature equal to or greater than the melting point of the first solder material is applied.

Figure 5:
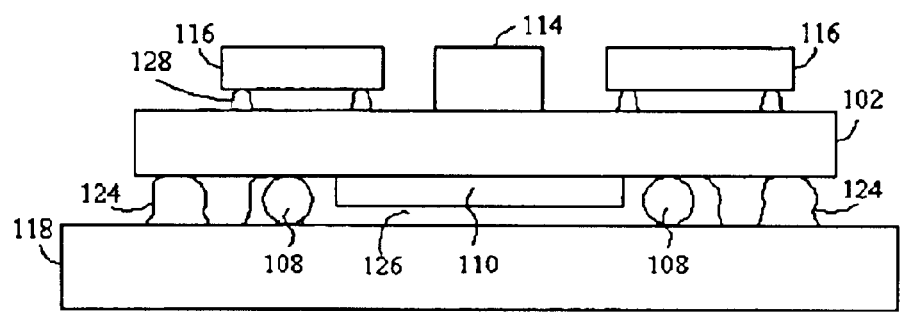
FIG. 5 is a cross-section of FIG. 4 along the lines V—V, after soldering heat has been applied.

FIG. 5 illustrates a cross-section of FIG. 4 along the line V—V, after the soldering heat has been applied. The cross-section of FIG. 5 shows the first solder joint 124 deformed due to the collapsing of the carrier substrate 102 in relation to the printed circuit board 118 and the melting of solder balls 106. Also shown in the cross-sectional view of FIG. 5 is the minimum dimension 126 defining an air space between the ASIC 110 and the printed circuit board 118, as defined by the second members 108 which maintain their dimensions when the soldering heat is applied. Also illustrated in the cross-section of FIG. 5 are the plurality of solder joints 128 created between the chip scale package memory 116 and the carrier substrate 102 when the soldering heat is applied. As recognized by one having ordinary skill in the art, the heat sink 114 is composed of material unaffected by the soldering heat, thereby maintaining its original form, and operating in accordance with known heat sink technology.

Figure 6:
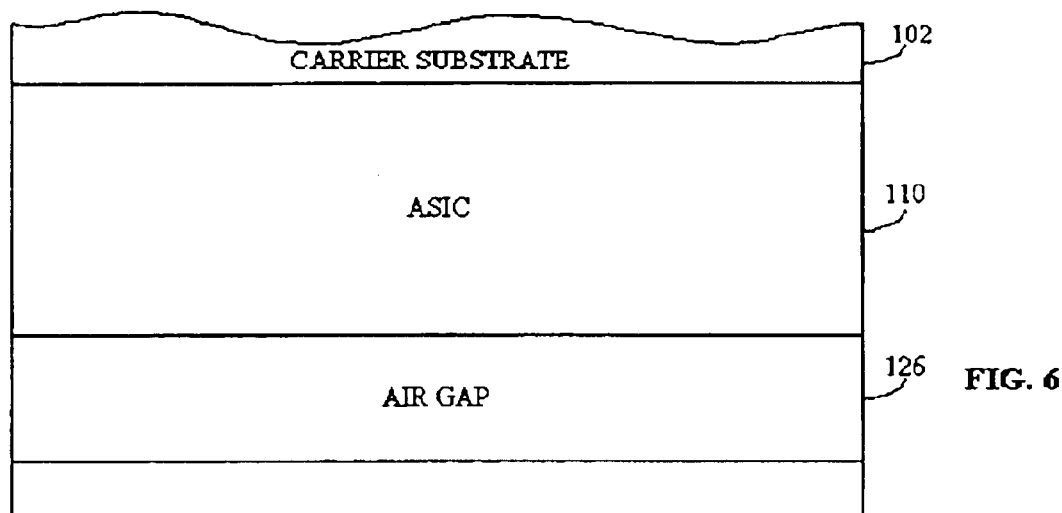
FIG. 6 is an enlarged view of a portion of the cross-section of FIG. 5, in accordance with one embodiment of the present invention.

FIG. 6 illustrates an enlarged view of the dimensions of the soldered processing system composed of the carrier substrate 102, the ASIC 110, the air gap 126 and the printed circuit board 118. In one embodiment, the air gap 122 defined by the solder ball collapse control has a height of approximately 100 microns, but as recognized by one having ordinary skill in the art, any other suitable air gap 126 dimension may be utilized, wherein the air gap 126 is defined by the solder ball collapse control of the solder ball array 105.

Figure 7:
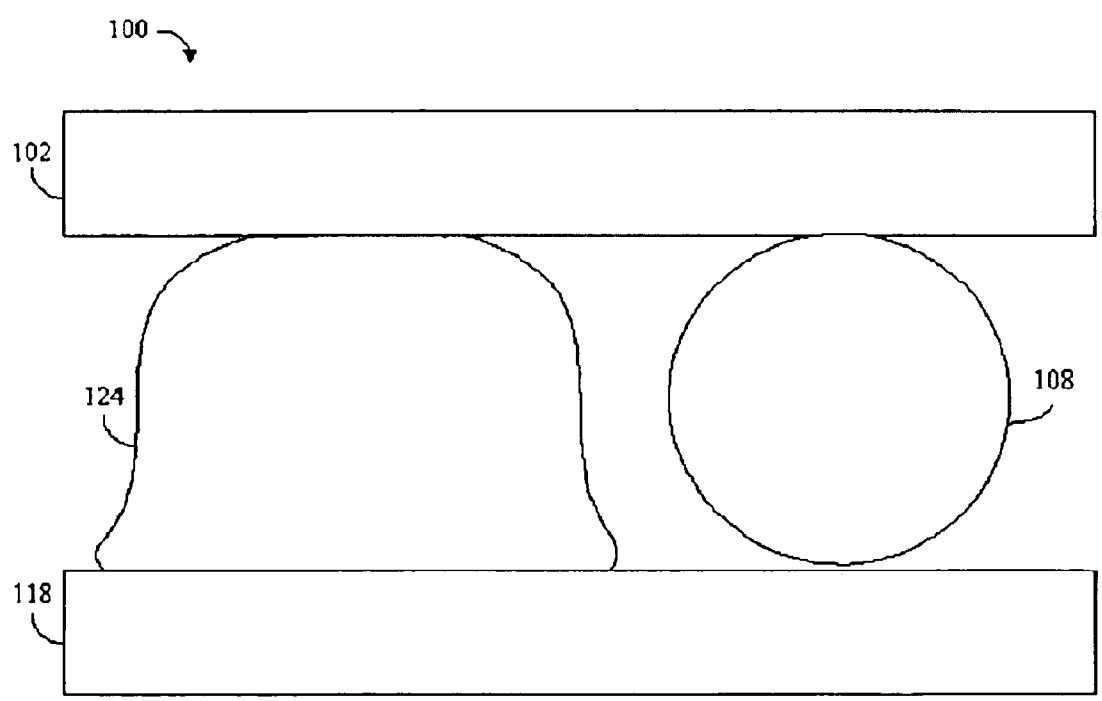
FIG. 7 illustrates the disposition of a first solder joint and a second solder ball after the application of the soldering heat.

FIG. 7 illustrates an enlarged view of the solder joint 124 between the carrier substrate 102 and the printed circuit board 118. Also illustrated is the second member 108 maintaining the minimum dimension. As stated above, the second solder member has a melting temperature greater than the melting temperature of the first solder members 106, therefore when the soldering heat is applied, only the first soldering members 106 are transformed into solder joints 128 causing the collapse of the integrated circuit 100 in relation to the printed circuit board 118, wherein the collapse is controlled by the second members 108.

Figure 8:
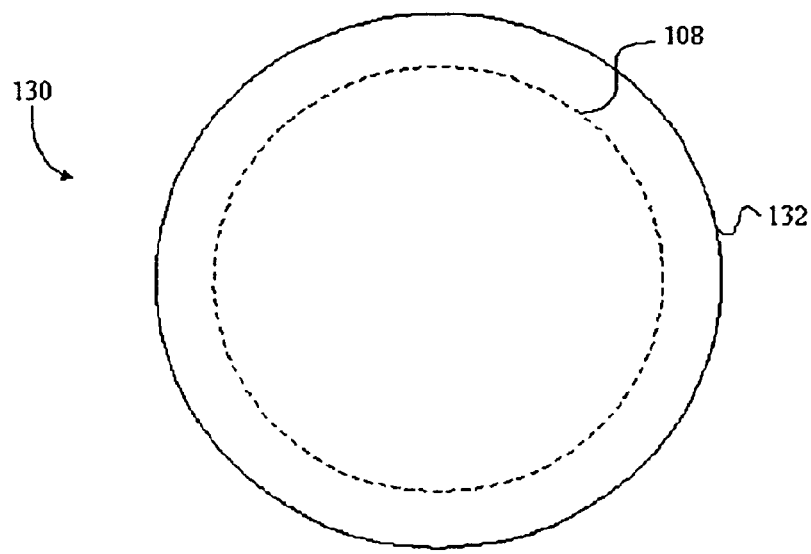
FIG. 8 illustrates a second solder ball, in accordance with another embodiment of the present invention.

FIG. 8 illustrates an alternative embodiment of a solder member 130 for use in the solder ball collapse control apparatus of FIG. 1. The second solder member 130 includes a solder member 108, as described with the first embodiment and with reference to FIGS. 1, 3 and 5. Further included in the alternative embodiment, the solder member 130 includes an outer layer 132 which encases the second solder member 108. In one embodiment, the outer layer 132 is composed of a material having a melting temperature similar to the first melting temperature with respect to the first solder members 106. As recognized by one having ordinary skill in the art, the outer layer 132 may be composed of any solder material having a melting temperature such that when the soldering heat is applied, the solder material thereupon melts. Similarly, as discussed above, the second solder member 130 is illustrated having a circular shape, but any other acceptable formation which will provide for soldering between the carrier substrate 102 and the printed circuit board 118 and capable of being deposited using the solder dispensing machine, is recognized herein.

Figure 9:
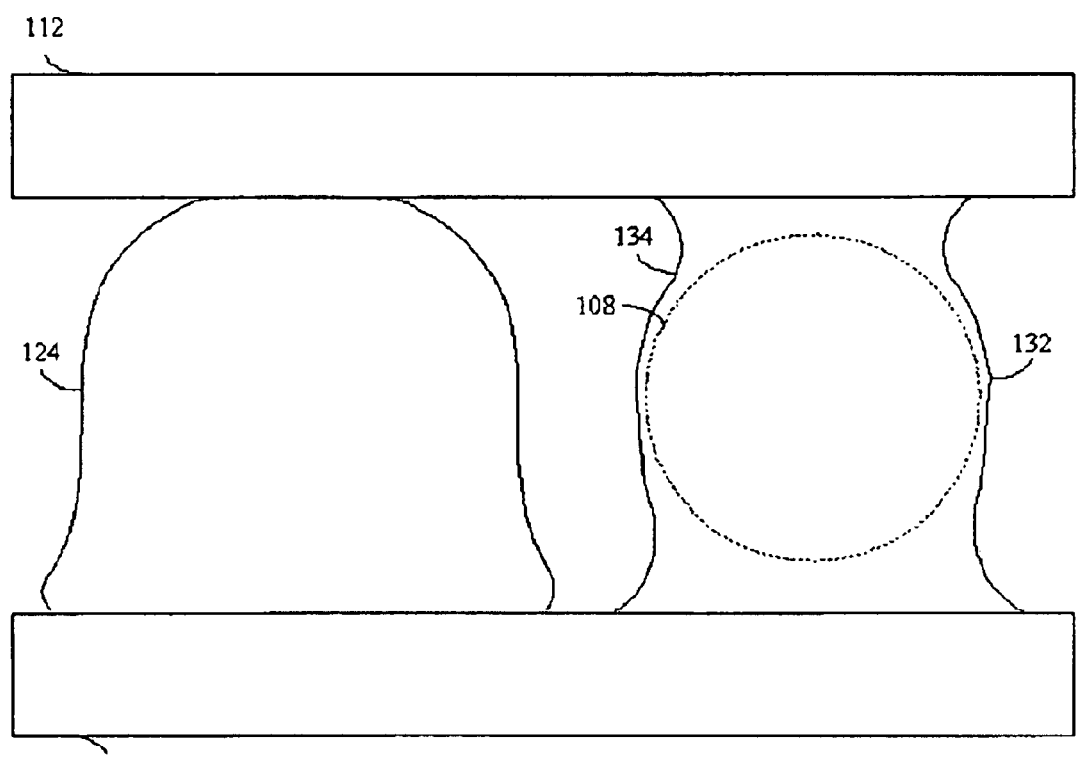
FIG. 9 illustrates an embodiment of the disposition of a first solder joint in relation to a control solder joint after the application of the soldering heat.

FIG. 9 illustrates another embodiment of the solder ball collapse control apparatus of the present invention. Similar to FIG. 7, the carrier substrate 102 is soldered to the printed circuit board 118 after a soldering heat is applied. Also illustrated in FIG. 9 is a solder control joint 132 which consists of the second member 108 having a melted outer layer 134. As such, when the soldering heat is applied, the solder joint 124 is formed and the control solder joint 134 is formed, meanwhile the second solder member 108 controls the collapse of the carrier substrate 102 with respect to the printed circuit board 118.

Figure 10:
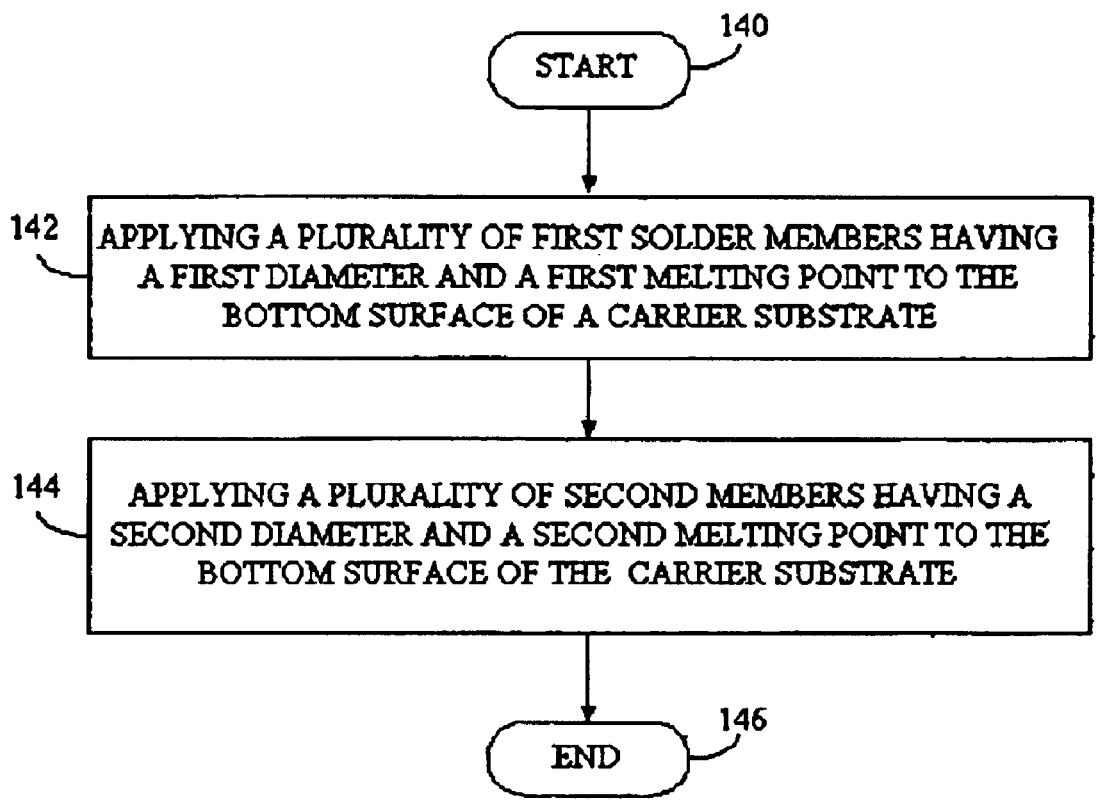
FIG. 10 illustrates a flowchart of the steps for making a solder ball array, in accordance with one embodiment of the present invention.

FIG. 10 illustrates a flowchart representing the steps of a method for making a solder member collapse system. The method begins 140, by applying a plurality of first solder members having a first diameter and a first melting temperature to the bottom surface of a carrier substrate, designated at step 142. As discussed above, a plurality of first solder members 106 have a first diameter, such as 0.6 millimeters and a first melting temperature of 183 degrees centigrade. Next, step 144 a plurality of second members having a second diameter and a second melting point are applied to the bottom surface of a carrier substrate. These plurality of second members, such as members 108 or members 130 are also disposed on the carrier substrate 104. In one embodiment, the first solder members are solder balls and the second members are also solder balls, but any other form of deposit as provided by the solder dispensing machine may be applied to the bottom surface of the carrier substrate. More specifically, the plurality of first solder members 106 and the plurality of second members, 108 or 130, make up the solder ball array 105 as illustrated in FIG. 1. Thereupon, a solder ball collapse control system is disposed on the bottom surface of the carrier substrate, step 146.

Figure 11:
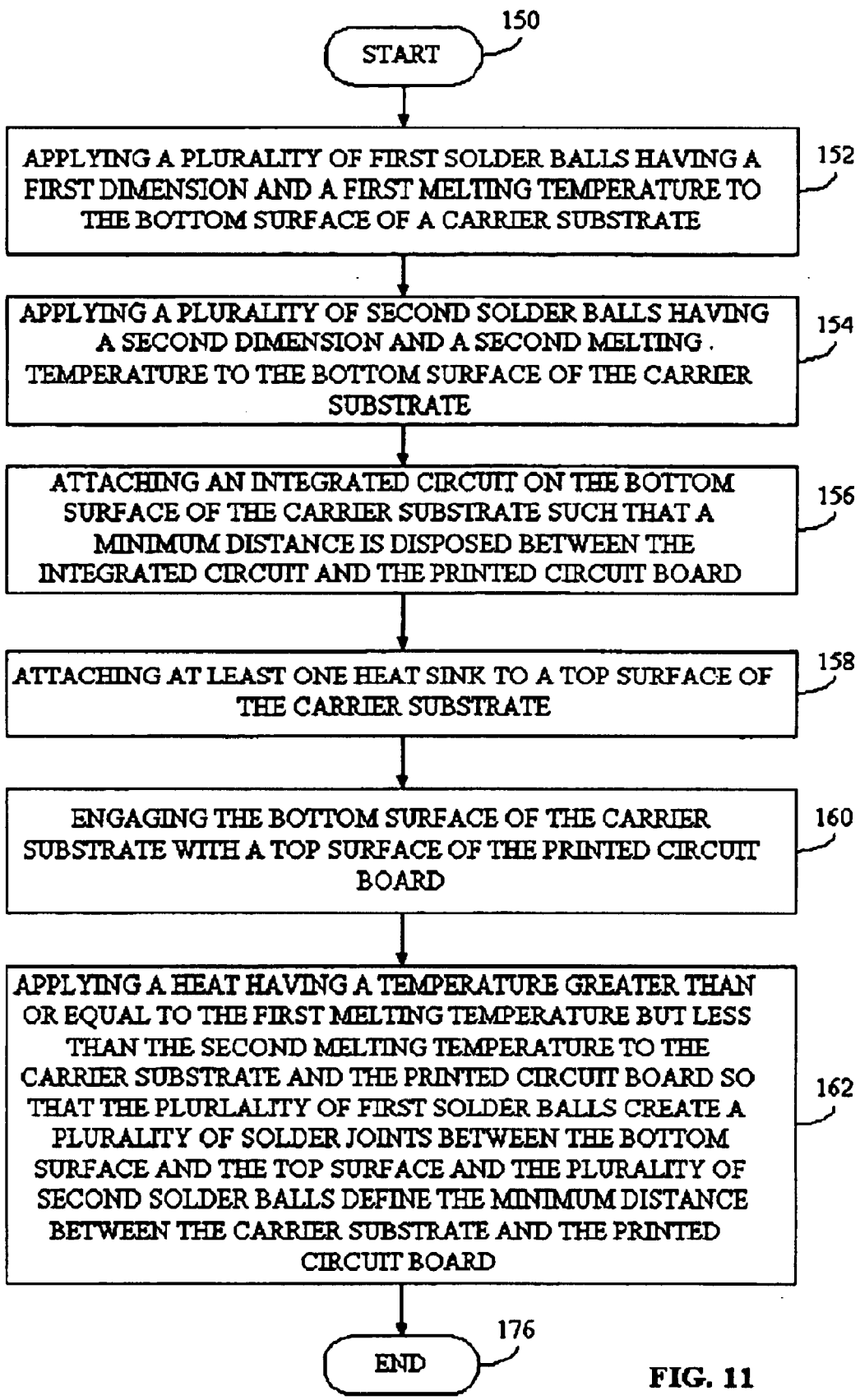
FIG. 11 illustrates a flowchart of the steps for making an integrated circuit in accordance with one embodiment of the present invention.

FIG. 11 illustrates a flowchart of the steps for making an integrated circuit in accordance with one embodiment of the present invention. The process begins, 150, by applying a plurality of first solder balls, such as solder members 106, having a first dimension and a first melting temperature to a bottom surface, such as 102, of a carrier substrate, such as 104, designated at step 152. Thereupon, step 154, the process includes applying a plurality of second solder balls, such as second members 108 or 130 having a second dimension and a second melting temperature to the bottom surface of the carrier substrate. Thereupon, the integrated circuit is made by attaching an integrated circuit, such as application specific integrated circuit 110, on the bottom surface of the carrier substrate such that a minimum distance, such as an air gap, is disposed between the integrated circuit and a printed circuit board, such as 118, designated at step 156.

Moreover, at least one heat sink, such as 114 or 122, is attached to a top surface, such as 112 of the carrier substrate, designated at step 158. Furthermore, the bottom surface of the carrier substrate is engaged with a top surface of the printed circuit board, designated at step 160. Thereupon, a heat having a temperature greater than or equal to the first melting temperature but less than the second melting temperature is applied to the carrier substrate and the printed circuit board such that the plurality of first solder balls create a plurality of solder joints between the bottom surface and the top surface and the plurality of second solder balls define the minimum distance between the carrier substrate and the printed circuit board, designated at step 162. As described above, the second solder balls control the collapse of the carrier substrate with respect to the printed circuit board by maintaining their second dimension in response to the soldering heat applied thereon. As discussed above, in one embodiment, the second solder balls maintain their full shape and define the air gap, and in another embodiment, the second solder balls create a solder control joint wherein the outer layer is melted and thereupon provides an electrical solder joint having a core of the original second solder members.

It should be understood that the limitations of other variations and modifications of the invention in its various aspects as may be readily apparent to those of ordinary skill in the art, and that the invention is not limited by the specific embodiments described herein. For example, the solder ball collapse control method and apparatus may be utilized for the soldering of a plurality of solderable elements wherein an air gap must be defined and maintained, and the dimension of the air gap 126 between the carrier substrate 102 and the printed circuit board 118 is for illustration purposes only and not herein so limiting. It is therefore contemplated to cover by the present invention any and all modifications, variations or equivalents that fall within the spirit and scope of the basic underlying principles disclosed and claimed herein.

What is claimed is:

1. A method for making an integrated circuit comprising:
    applying a plurality of first solder balls having a first dimension and a first melting temperature to a bottom surface of a carrier substrate using a solder dispensing machine;
    applying a plurality of second solder balls having a second dimension and a second melting temperature to the bottom surface of the carrier substrate using a solder dispensing machine;
    engaging the bottom surface of the carrier substrate with a top surface of a printed circuit board; and
    applying a soldering heat, the soldering heat having a temperature greater than or equal to the first melting temperature and less than the second melting temperature, to the carrier substrate and printed circuit board so that the plurality of first solder balls create a plurality of solder joints between the bottom surface and the top surface and the plurality of second solder balls define a minimum distance between the carrier substrate and the printed circuit board.

2. The method of claim 1 further comprising:

prior to engaging the bottom surface of the carrier substrate with the top surface of the printed circuit board, attaching an integrated circuit on the bottom surface of the carrier substrate, such that the minimum distance is disposed between the integrated circuit and the printed circuit board.

3. The method of claim 1 further comprising:

prior to engaging the bottom surface of the carrier substrate with the top surface of the printed circuit board, attaching at least one heat sink to a top surface of the carrier substrate.

4. The method of claim 1 wherein each of the plurality of second solder balls further include an outer layer composed of a material having the first melting temperature such that when the printed circuit board and the carrier substrate are heated, the plurality of second solder balls create a control solder joint, which includes a melted outer layer and the second solder ball having the second diameter.

5. An integrated circuit comprising:

a carrier substrate having a bottom surface and an application specific integrated circuit disposed on the bottom surface of the carrier substrate and wherein the minimum distance is defined between the application specific integrated circuit and the printed circuit board;

a printed circuit board having a top surface;

a solder ball array coupling the bottom surface of the carrier substrate to the top surface of the printed circuit board, the solder ball array comprising:

a plurality of first solder balls composed of a first material having a first diameter and a first melting temperature; and a plurality of second solder balls composed of a second material having a second diameter and a second melting temperature; and such that when a heat, having a temperature greater than or equal to the first melting temperature but less then the second melting temperature, is applied, the plurality of first solder balls create a plurality of solder joints between the top surface and the bottom surface and the plurality of second solder balls define a minimum distance between the carrier substrate and the printed circuit board.

6. The integrated circuit of claim 5 wherein the carrier substrate further includes at least one heat sink disposed on a top surface of the carrier substrate.

7. The integrated circuit of claim 5 wherein each of the plurality of second solder balls further include an outer layer composed of the first material.

8. An integrated circuit prepared by a process comprising:

applying a plurality of first solder balls having a first dimension and a first melting temperature to a bottom surface of a carrier substrate using a solder dispensing machine;

applying a plurality of second solder balls having a second dimension and a second melting temperature to the bottom surface of the carrier substrate using a solder dispensing machine;

engaging the bottom surface of the carrier substrate with a top surface of a printed circuit board; and applying a soldering heat, the soldering heat having a temperature greater than or equal to the first melting temperature and less than the second melting temperature, to the carrier substrate and printed circuit board so that the plurality of first solder balls create a plurality of solder joints between the bottom surface and the top surface and the plurality of second solder balls define a minimum distance between the carrier substrate and the printed circuit bid.

9. The integrated circuit of claim 8 prepared by the process further comprising:

prior to engaging the bottom surface of the carrier substrate with the top surface of the printed circuit board, attaching an integrated circuit on the bottom surface of the carrier substrate, such that the minimum distance is disposed between the integrated circuit and the printed circuit board.

10. The integrated circuit of claim 8 prepared by the process further comprising:

prior to engaging the bottom surface of the carrier substrate with the top surface of the printed circuit board, attaching at least one heat ink to a top surface of the carrier substrate.

11. The integrated circuit of claim 8 wherein each of the plurality of second solder balls further include an outer layer composed of a material having the first melting temperature such that when the printed circuit board and the carrier substrate are heated, the plurality of second solder balls create a control solder joint, which includes a melted outer layer and the second solder ball having the second diameter.

* * * * *